United States Patent
Hoven et al.

(10) Patent No.: US 11,388,831 B2
(45) Date of Patent: Jul. 12, 2022

(54) INDUSTRIAL CONTROL PROJECTIVE CAPACITIVE TOUCH INTERFACE

(71) Applicant: Watlow Electric Manufacturing Company, St. Louis, MO (US)

(72) Inventors: Mark Hoven, Winona, MN (US); Andrew Borkowski, St. Louis, MO (US); Bret Wadewitz, Winona, MN (US); Robert Pape, St. Louis, MO (US); Jeremy Quandt, Winona, MN (US); Theodore Von Arx, St. Louis, MO (US); Austin Johannes, St. Louis, MO (US); Stephen White, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 106 days.

(21) Appl. No.: 16/909,296

(22) Filed: Jun. 23, 2020

(65) Prior Publication Data
US 2020/0404801 A1    Dec. 24, 2020

Related U.S. Application Data

(60) Provisional application No. 62/865,274, filed on Jun. 23, 2019.

(51) Int. Cl.
*H05K 7/14*     (2006.01)
*G06F 3/041*    (2006.01)
*G06F 3/044*    (2006.01)
*H01R 13/514*   (2006.01)

(52) U.S. Cl.
CPC .......... *H05K 7/1427* (2013.01); *G06F 3/044* (2013.01); *G06F 3/0416* (2013.01); *H01R 13/514* (2013.01)

(58) Field of Classification Search
None
See application file for complete search history.

(56) References Cited

U.S. PATENT DOCUMENTS

| | | |
|---|---|---|
| D601,103 S | 9/2009 | Pape et al. |
| 7,826,232 B2 | 11/2010 | Von Arx et al. |
| 7,898,819 B2 | 3/2011 | Pfingsten et al. |
| 9,983,783 B2 | 5/2018 | Krause |

(Continued)

FOREIGN PATENT DOCUMENTS

| | | |
|---|---|---|
| CN | 101542406 A | 9/2009 |
| TW | O149962 | 11/2012 |
| TW | O157828 | 12/2013 |

OTHER PUBLICATIONS

International Search Report for International Application PCT/US2020/039078, dated Sep. 9, 2020.

(Continued)

*Primary Examiner* — Stephen T. Reed
(74) *Attorney, Agent, or Firm* — Burris Law, PLLC

(57) ABSTRACT

An industrial control device includes a display, a body, and a controller. The body includes a capacitive slider sensor, a graphic, and a window. The graphic overlaps the capacitive slider sensor. The window is transparent and aligned with the display to permit the display to be viewed through the window. The controller is coupled to an output of the capacitive slider sensor to receive signals from the capacitive slider sensor. The controller is coupled to the display and configured to control the display.

22 Claims, 15 Drawing Sheets

(56) References Cited

U.S. PATENT DOCUMENTS

| | | | |
|---|---|---|---|
| 2007/0171196 A1 | 7/2007 | Pfingsten | |
| 2007/0173092 A1* | 7/2007 | Von Arx | H01R 13/514 |
| | | | 439/188 |
| 2008/0257706 A1 | 10/2008 | Haag | |
| 2015/0160850 A1* | 6/2015 | Krause | G06F 3/016 |
| | | | 345/174 |
| 2018/0062648 A1 | 3/2018 | Hirai | |

OTHER PUBLICATIONS

Duratech Industries, IME, In Mold Electronics, IME Advanced Molding Technology, product pp. 1-3, Jun. 19, 2019.
Duratech Industries, In-Mold Decorating, In-Mold Decorating Labels, product pp. 1-3, Jun. 19, 2019.
In-Mold Electronics—Inno-Flex, product pp. 1-6, Jun. 19, 2019.
Butler Technologies, What is Film Insert Molding, product pp. 1-9, Mar. 1, 2019.

* cited by examiner

INDUSTRIAL CONTROL PROJECTIVE CAPACITIVE TOUCH INTERFACE

CROSS-REFERENCE TO RELATED APPLICATIONS

This application claims priority to and the benefit of U.S. provisional application Ser. No. 62/865,274, filed on Jun. 23, 2019, the contents of which are incorporated herein by reference in their entirety.

FIELD

The present disclosure relates to industrial controls, and more specifically to industrial control interfaces for temperature controllers.

BACKGROUND

The statements in this section merely provide background information related to the present disclosure and may not constitute prior art.

Industrial control devices, such as those for use with industrial temperature controllers, include an interface for viewing and/or controlling a system, e.g., a temperature controller of a heater. Such industrial control interfaces typically include a display and a several physical buttons for changing the display or adjusting settings of the temperature controller. Examples of such temperature control devices and interfaces are described in U.S. Pat. Nos. 7,826,232, 7,898,819, U.S. Pat. No. D601,103, and U.S. Publication No. 2007/0171196, the disclosures of which are incorporated herein by reference in their entirety.

Physical buttons of typical industrial controller interfaces require moving parts that can wear and break over time. Furthermore, industrial controller interfaces can be exposed to extreme conditions including high temperatures, freezing temperatures, large and/or rapid temperature fluxuations, fluids (e.g., oils, water, fuel, corrosive fluids, cleaning fluids), and impacts from objects. In some applications, physical buttons provide leak paths for such fluids. In some applications, the physical buttons have flexible materials that separate the electronic components and button mechanisms from the exterior environment. These flexible materials have the potential to wear out, crack, or break, which may expose the mechanisms and/or electronics to the hazardous exterior environment. Furthermore, some physical buttons or switches may be inadvertently triggered by unintended contact with objects. Additionally, input into the device is typically limited to the specific function of the physical buttons or switches.

These issues related to typical industrial controllers and their interfaces are addressed by the teachings of the present disclosure.

SUMMARY

In one form, an industrial control device includes a display, a body, and a controller. The body includes a capacitive slider sensor, a first input graphic, and a window. The first input graphic overlaps the capacitive slider sensor. The window is transparent and aligned with the display to permit the display to be viewed through the window. The controller is coupled to an output of the capacitive slider sensor to receive signals from the capacitive slider sensor. The controller is coupled to the display and configured to control the display. In a variety of alternate forms of the present disclosure: the body is a molded body, the capacitive slider sensor is an in-molded capacitive slider sensor, and the first input graphic is an in-molded graphic; the molded body is a transparent polymer injection molded around an applique; the output of the capacitive slider sensor includes a plurality of in-molded electrical traces and the industrial control device further includes a plurality of connector pins directly connected to the plurality of in-molded electrical traces, the connector pins coupling the in-molded electrical traces to the controller for electrical communication therebetween; the industrial control device further includes a carrier including a carrier plate and a plurality of board supports extending from a back side of the carrier plate, wherein the display is coupled to a front side of the carrier plate, wherein the controller includes a first circuit board and a plurality of second circuit boards, the first circuit board is coupled to the back side of the carrier plate and each second circuit board is received in a slot defined by a corresponding pair of board supports of the plurality of board supports; one of the body and the carrier plate includes a plurality of locating ridges and the other of the body and the carrier plate defines a plurality of alignment grooves, each locating ridge being received in a corresponding alignment groove; the capacitive slider sensor is a projective capacitive slider sensor; the body further includes a plurality of second input graphics and a plurality of capacitive input sensors, each of the second input graphics overlapping a corresponding one of the capacitive input sensors; a front surface of the body is a rigid material, the capacitive slider sensor being configured to be activated by contact with the front surface at an area overlapping the first input graphic and each second capacitive input sensor being configured to be activated by contact with the front surface at an area overlapping the corresponding second input graphic; the controller is configured to adjust a set point value based on input from the capacitive slider sensor; the controller is configured to change the set point value an amount proportional to a speed of a user activating the capacitive slider sensor; the industrial control device further includes a housing coupled to the body, wherein the controller is disposed within the housing; the housing includes a plurality of retaining clips and the body defines a plurality of retention apertures, each retaining clip resiliently snapping into a corresponding one of the retention apertures to couple the housing to the body; the housing defines a plurality of ventilation apertures; the body includes an inner shroud and an outer shroud, the inner shroud being disposed about the display and the outer shroud being disposed about the inner shroud and spaced apart therefrom to define a cavity, wherein the industrial control device further comprises a seal member disposed in the cavity and configured to form a seal with a facia plate disposed about the inner shroud; the industrial control device further includes the facia plate, wherein the facia plate defines an aperture through which the inner shroud extends, the outer shroud being disposed about the aperture; the industrial control device further includes a housing, a front collar, a rear collar, a pair of screws, and a pair of retaining clips, wherein the housing is coupled to the body and the controller is disposed within the housing, wherein the inner shroud defines a pair of retention apertures, the front collar being disposed about the inner shroud between the inner apertures and the facia plate and defining a pair of abutment surfaces, the rear collar being disposed about the housing, each retaining clip extending from the rear collar in a direction toward the front collar and being received in a corresponding one of the retention apertures, and each screw being threadably engaged to the rear collar and abutting a corresponding one of the abutment surfaces; the controller is configured to control the display to visually output a numeric value of a current process, the controller being configured to adjust a font size of the numeric value based on an amount of digits of the numeric value.

In another form, an industrial control device includes a display, a body, a housing, and a controller. The body includes a molded transparent rigid material, a projective capacitive slider sensor, a plurality of electrically conductive traces, a first input graphic, and a background graphic. The projective capacitive slider sensor, the plurality of electrically conductive traces, the first input graphic, and the background graphic are in-molded in the transparent rigid material. The background graphic defines a window. The first input graphic overlaps the projective capacitive slider sensor. The window is transparent and aligned with the display to permit the display to be viewed through the window. The plurality of electrically conductive traces are coupled to the projective capacitive slider sensor for electrical communication therewith. The housing is coupled to the body. The controller is disposed within the housing and coupled to the plurality of electrically conductive traces to receive signals from the projective capacitive slider sensor. The controller is coupled to the display and configured to control the display. According to a variety of alternate forms: the body includes an inner shroud and an outer shroud, the inner shroud being disposed about the display and the outer shroud being disposed about the inner shroud and spaced apart therefrom to define a cavity, wherein the industrial control device further comprises a seal member disposed in the cavity and configured to form a seal with a facia plate disposed about the inner shroud; the industrial control device further includes a front collar, a rear collar, a pair of screws, and a pair of retaining clips, wherein the inner shroud defines a pair of retention apertures, the front collar being disposed about the inner shroud between the inner apertures and the facia plate and defining a pair of abutment surfaces, the rear collar being disposed about the housing, each retaining clip extending from the rear collar in a direction toward the front collar and being received in a corresponding one of the retention apertures, and each screw being threadably engaged to the rear collar and abutting a corresponding one of the abutment surfaces.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
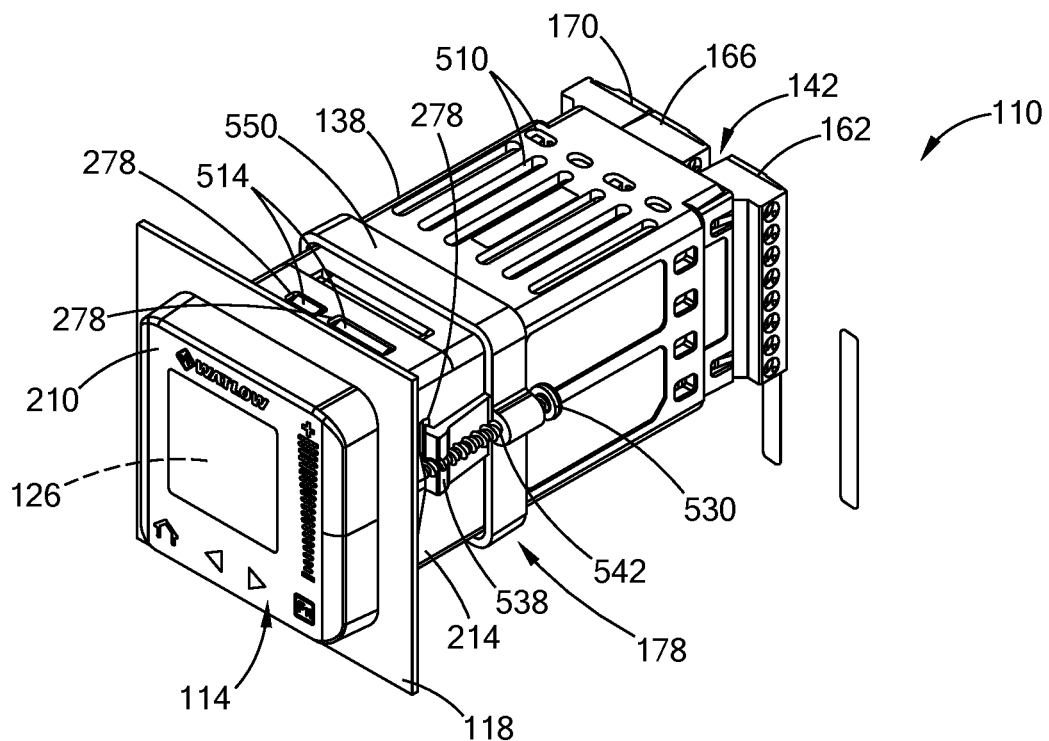
FIG. 1 is a first perspective view of an industrial controller device in accordance with the teachings of the present disclosure.
Figure 2:
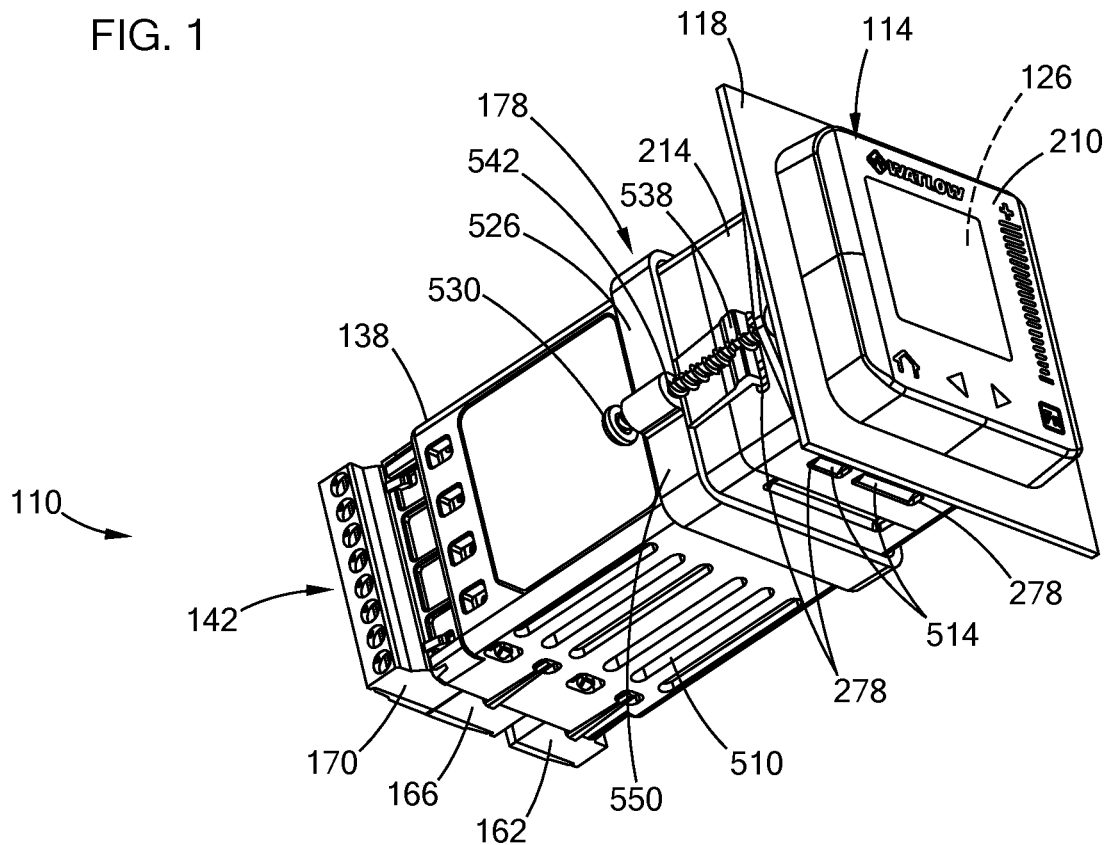
FIG. 2 is a second perspective view of the industrial controller device of FIG. 1.
Figure 3:
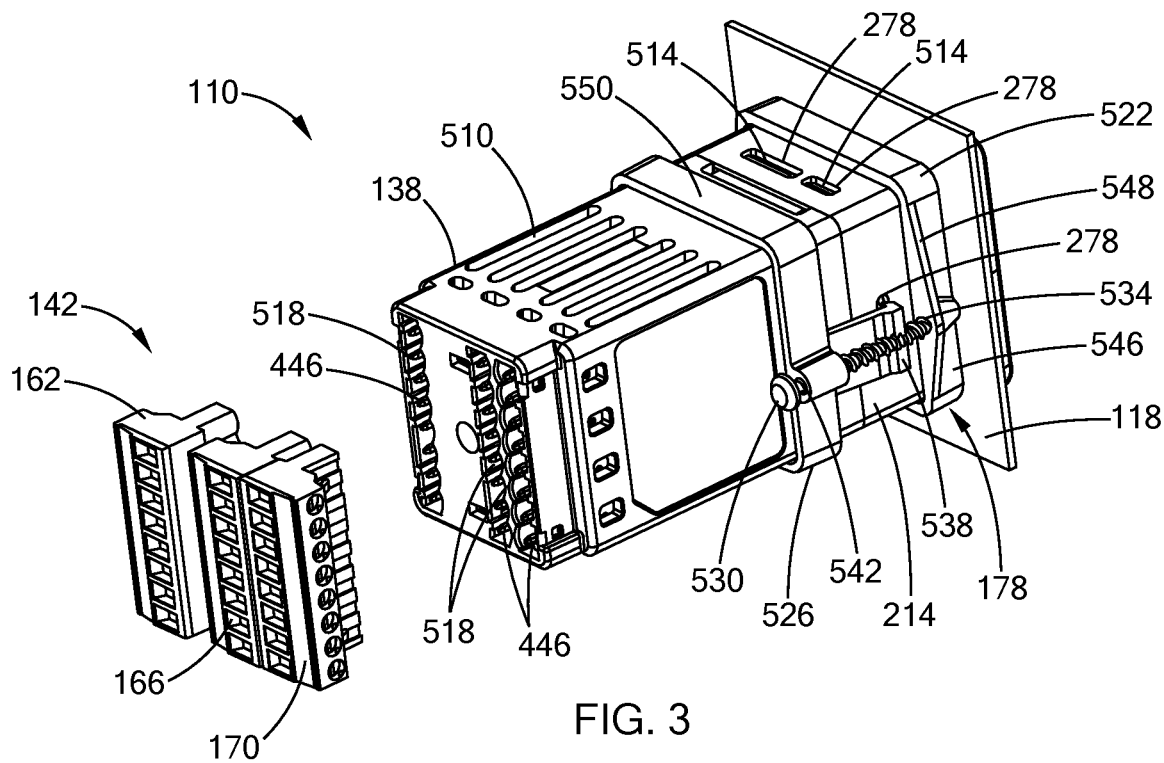
FIG. 3 is a third perspective view of the industrial controller device of FIG. 1, illustrating connectors of the industrial controller device disconnected in accordance with the teachings of the present disclosure.
Figure 4:
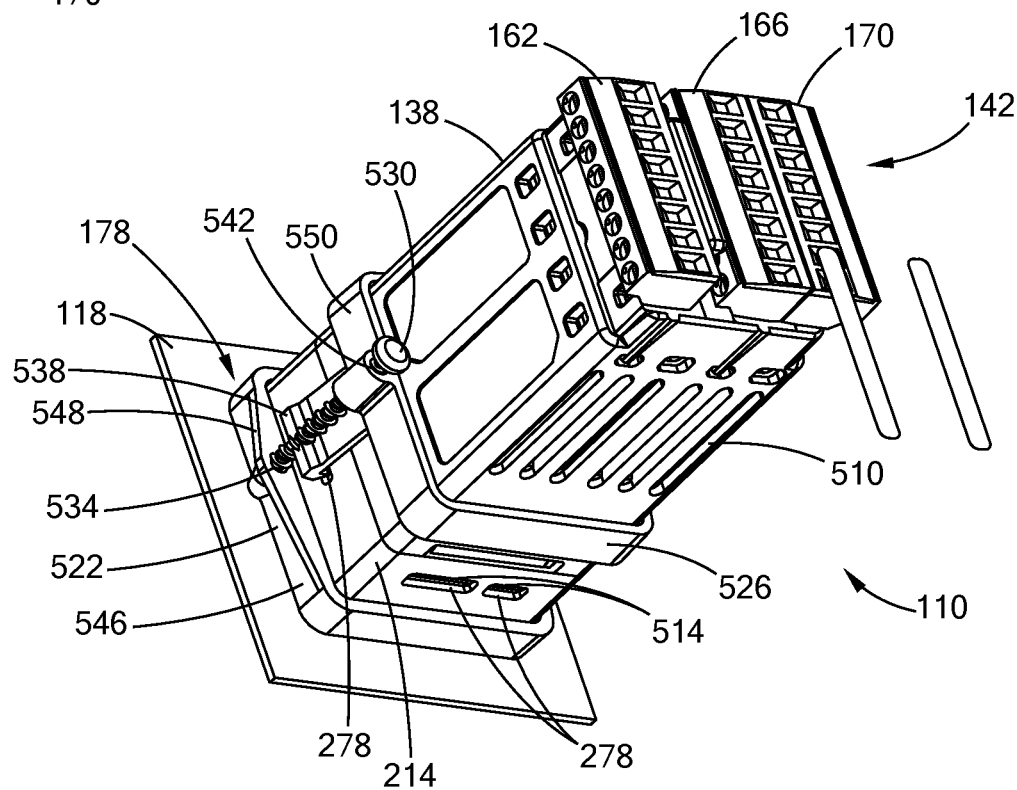
FIG. 4 is a fourth perspective view of the industrial controller device of FIG. 1.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 5:
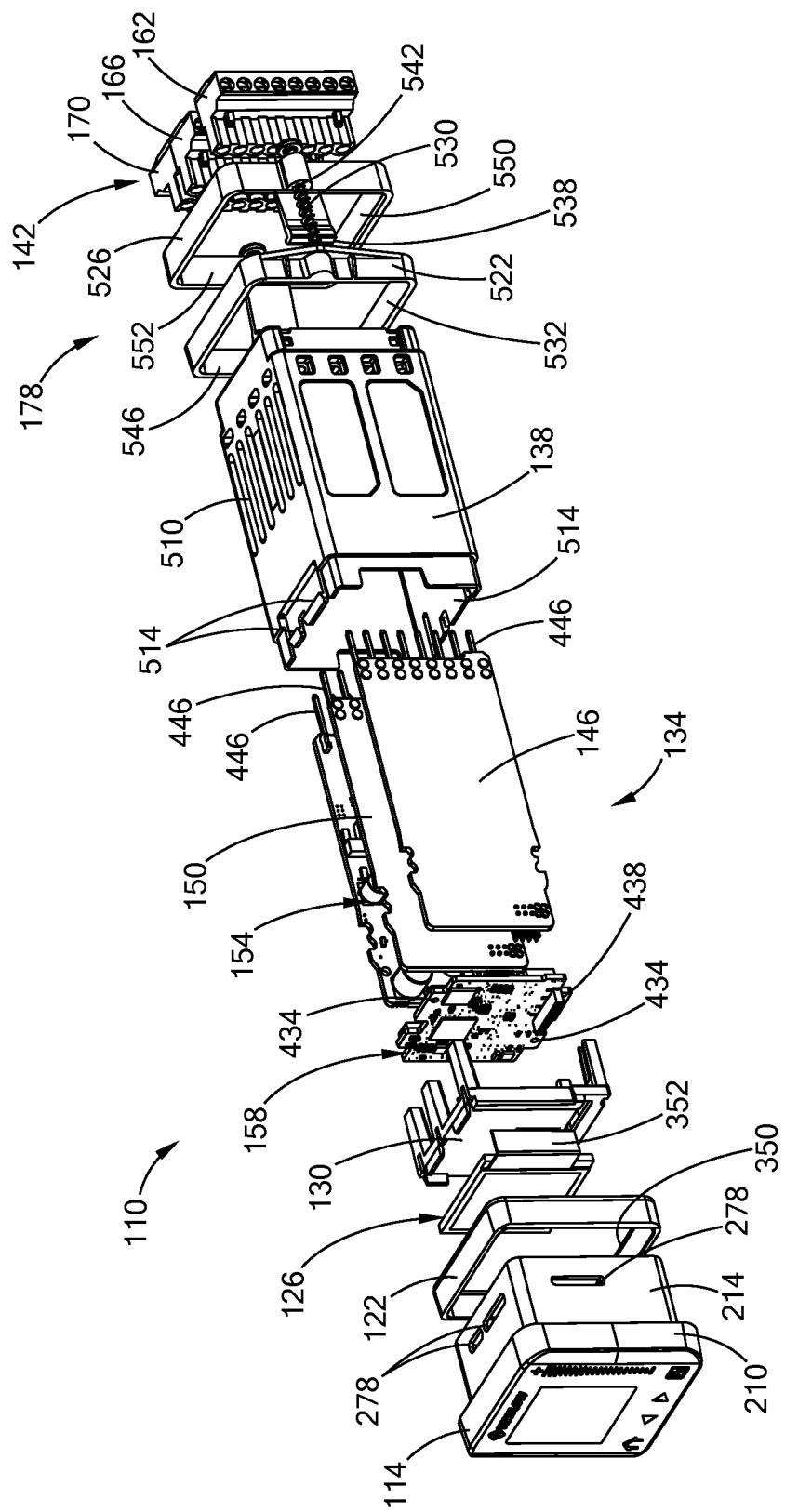
FIG. 5 is an exploded perspective view of the industrial controller device of FIG. 1.

Referring to FIGS. 1-5, an industrial controller device 110 is illustrated. Referring specifically to FIG. 5, the industrial controller device 110 includes a front panel body 114, a facia plate 118 (shown in FIGS. 1-4), a gasket 122, a display 126, a carrier 130, a controller 134, a housing 138, and one or more connectors 142. In the example provided, the controller 134 includes one or more circuit boards such as a first board 146, a second board 150, a third board 154, and a fourth board 158, and the industrial controller device 110 includes a first connector 162 connected to the first board 146, a second connector 166 connected to the second board 150, and a third connector 170 connected to the third board 154. The industrial controller device 110 may optionally also include a collar assembly 178.

Referring now to FIGS. 10B-20, the front panel body 114 includes a front facia 210 and an inner shroud 214. As described in greater detail below, the front panel body 114 is a body molded in transparent or substantially clear resin (e.g., polymer) and includes an in-molded applique 218 (See FIGS. 7-9) that has in-molded ink 222 (See FIG. 7) that defines images, icons, text, and/or colored areas and in-molded electronics 226 (See FIG. 8) that output signals and cooperate with the in-molded ink 222 to form a user interface 230.

In the example provided, the in-molded ink 222 defines an opaque background 234, a home input graphic 238, left and right input graphics 242, 246, a function input graphic 250, a slider input graphic 254, and a logo 258, though other configurations can be used including more or fewer input graphics. The front facia 210 also includes a window 262 defined by an interior border of the background 234 (i.e., where the background 234 is not present) so that the front facia 210 remains transparent at the window 262 while having a continuous flat surface across the entire front of the front facia 210 including across the window 262. As described in greater detail below, the front panel body 114 is molded of a rigid resin (e.g., polymer) such that the input graphics 238, 242, 246, 250, and 254 do not depress like traditional buttons when a user contacts the input graphic 238, 242, 246, 250, or 254 to operate the industrial controller device 110. This provides a durable, fluid resistant, compact, and aesthetically appealing user interface 230.

Figure 12:
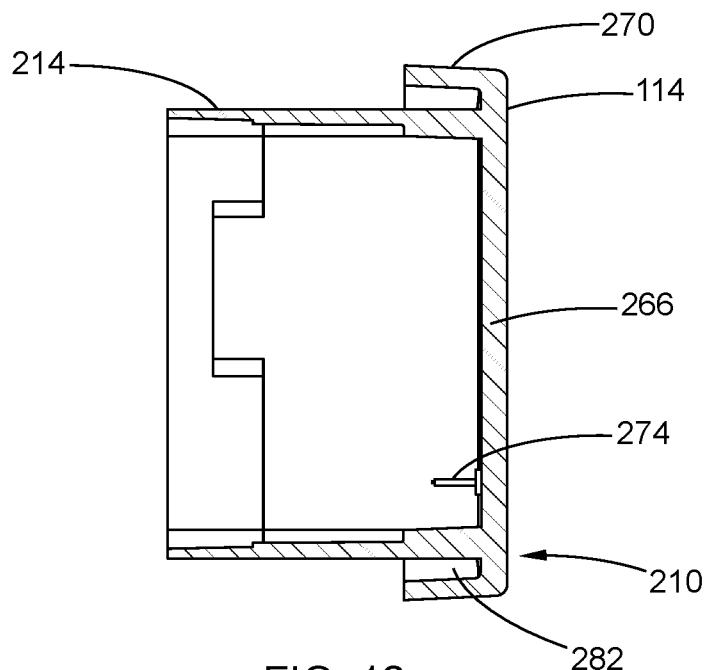
FIG. 12 is a cross-sectional view of the front panel body of FIG. 10, taken along line A-A shown in FIG. 11.
Figure 13:
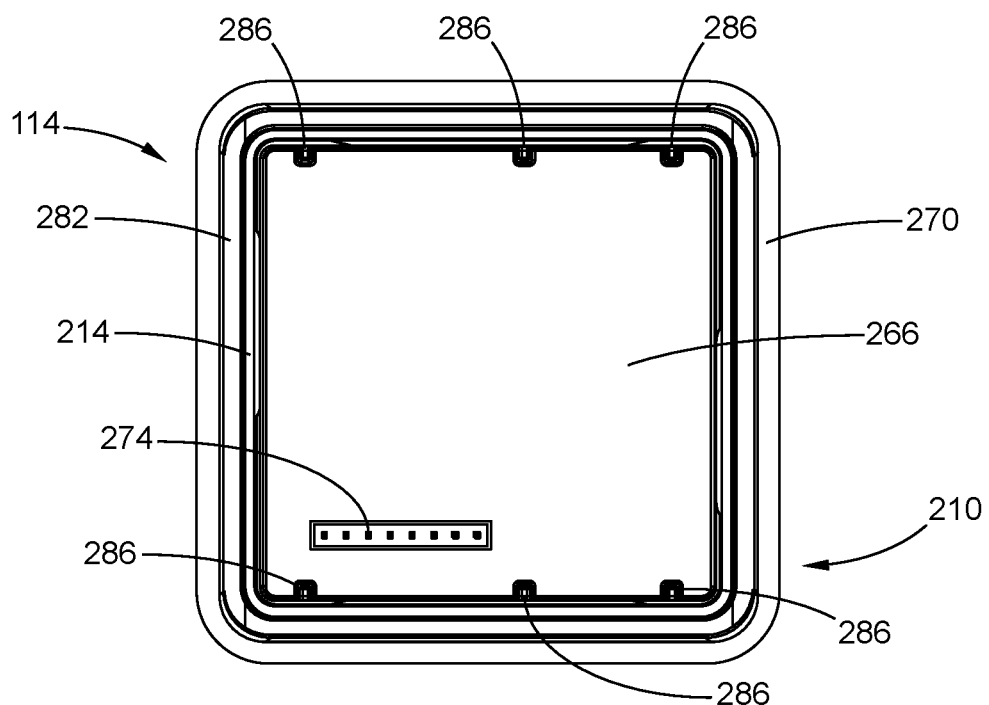
FIG. 13 is a rear view of the front panel body of FIG. 10.
Figure 14:
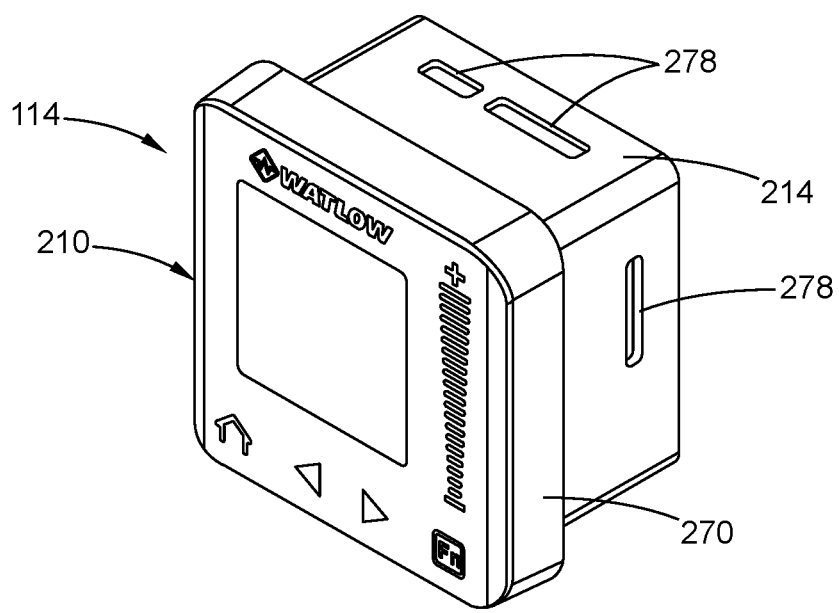
FIG. 14 is another front perspective view of the front panel body of FIG. 10.
Figure 15:
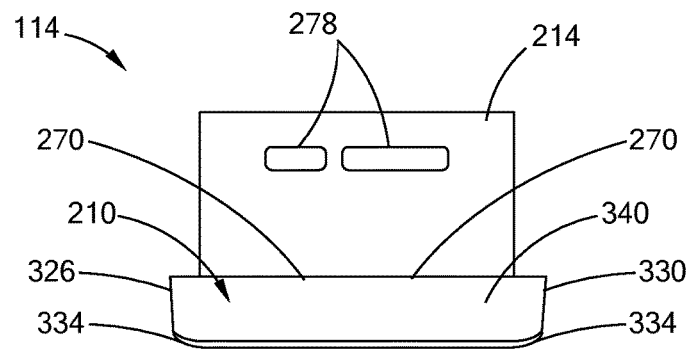
FIG. 15 is a top view of the front panel body of FIG. 10.
Figures 16, 17, 18:
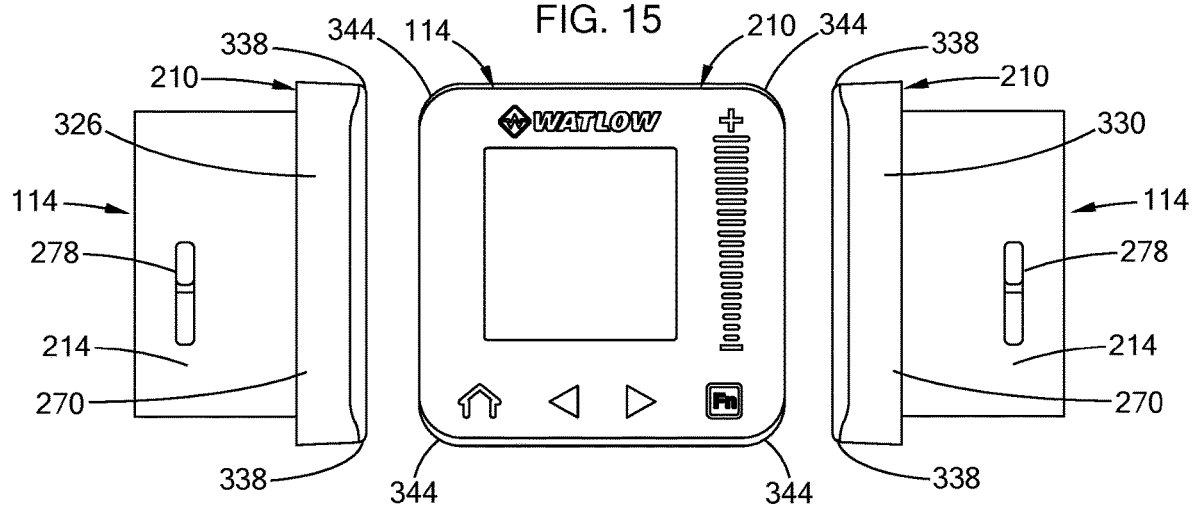
FIG. 16 is a side view of the front panel body of FIG. 10.
FIG. 17 is a front view of the front panel body of FIG. 10.
FIG. 18 is another side view of the front panel body of FIG. 10.
Figure 19:
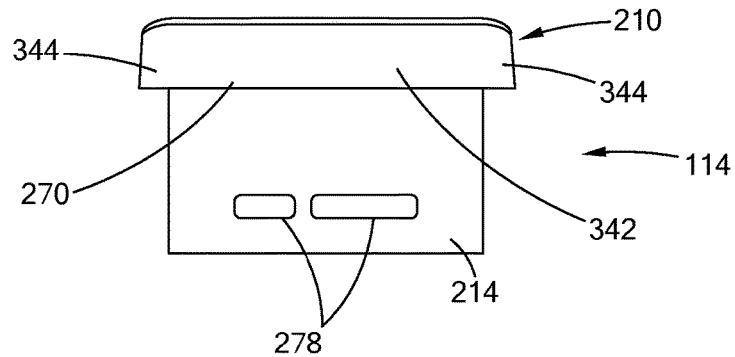
FIG. 19 is a bottom view of the front panel body of FIG. 10.
Figure 20:
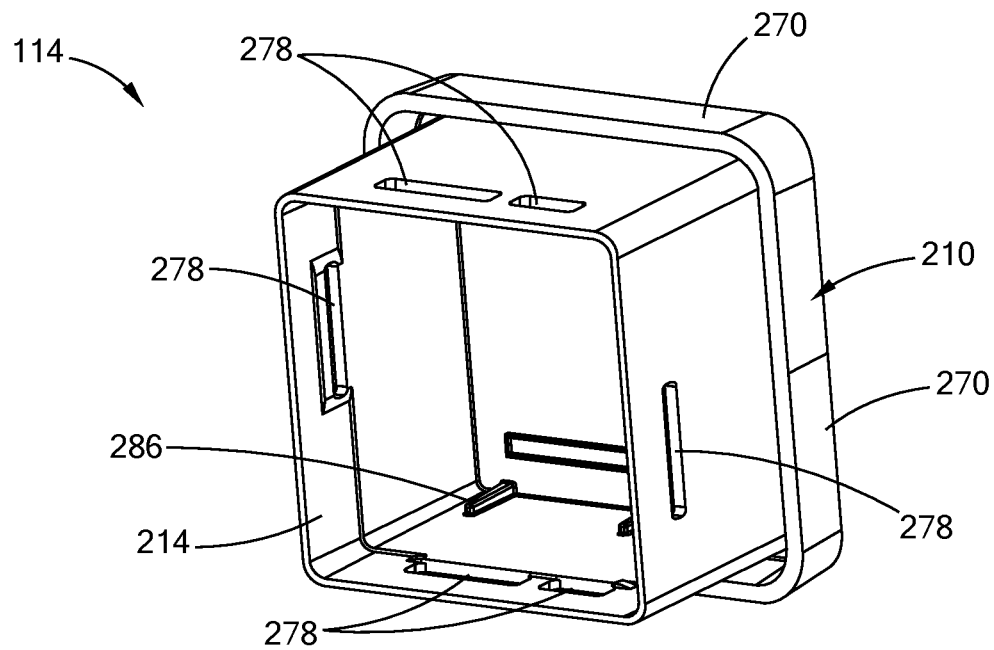
FIG. 20 is a rear perspective view of the front panel body of FIG. 10.

The front facia 210 includes a facia wall 266 and an outer shroud 270. The outer shroud 270 extends rearward from the facia wall 266. As best shown in FIGS. 12 and 13, a plurality of connector pins 274 of the in-molded electronics 226 (See FIG. 8) protrude from the rear side of the facia wall 266. The inner shroud 214 extends rearward from the facia wall 266 a greater distance than the outer shroud 270. In the example provided, the inner and outer shrouds 214, 270 have generally rectangular or square shapes with rounded corners, though other configurations can be used.

The inner shroud 214 defines a plurality of retention apertures 278 and, in the example provided, at least one retention apertures 278 extends completely through each side of the inner shroud 214. The outer shroud 270 is disposed about the inner shroud 214 and spaced apart therefrom to define a gasket cavity 282 that extends completely around the front panel body 114. The inner shroud 214 also defines a plurality of locating ridges 286 on an interior of the inner shroud 214.

In the example provided, the background 234 is disposed on the facia wall 266 and all sides of the outer shroud 270. In the example provided, the window 262 is disposed on the facia wall 266 and the logo 258 and input graphics 238, 242, 246, 250, 254 are disposed adjacent to the window 262 on the facia wall 266, though other configurations can be used. In the particular example provided, the home input graphic 238, left input graphic 242, right input graphic 246, and function input graphic 250 are located below the window 262 while the slider input graphic 254 is located to the right (when viewed head on) of the window 262, though other configurations can be used.

The slider input graphic 254 is a series of icons or shaded or colored regions along an elongated area (indicated in the figures by dashed lines 310) of the facia wall 266. In the example provided, a plus symbol 314 is located at one end of the elongated area 310, a minus symbol 318 is located at the opposite end of the elongated area 310, and a plurality of dashes 322 are disposed between the plus and minus symbols 314, 318, with the dashes 322 progressively increasing in length with proximity to the plus symbol 314, though other configurations can be used. For example, the plus and minus symbols 314, 318 could be replaced with up and down arrows respectively. In the example provided, the dashes 322 are blue proximate to the minus symbol 318 and red proximate to the plus symbol 314, though other configurations can be used.

Referring specifically to FIGS. 15-19, left and right sides 326, 330 of the front facia 210 transition to the facia wall 266 via rounded transitions 334 that have a radius of curvature that is greater than rounded transitions 338 that transition the facia wall 266 to top and bottom sides 340, 342 of the front facia 210, though other configurations can be used. In the example provided, the front facia 210 has generally rounded corners, such that adjacent ones of the sides 326, 330, 340, 342 transition into each other via rounded transitions 344.

Figure 6:
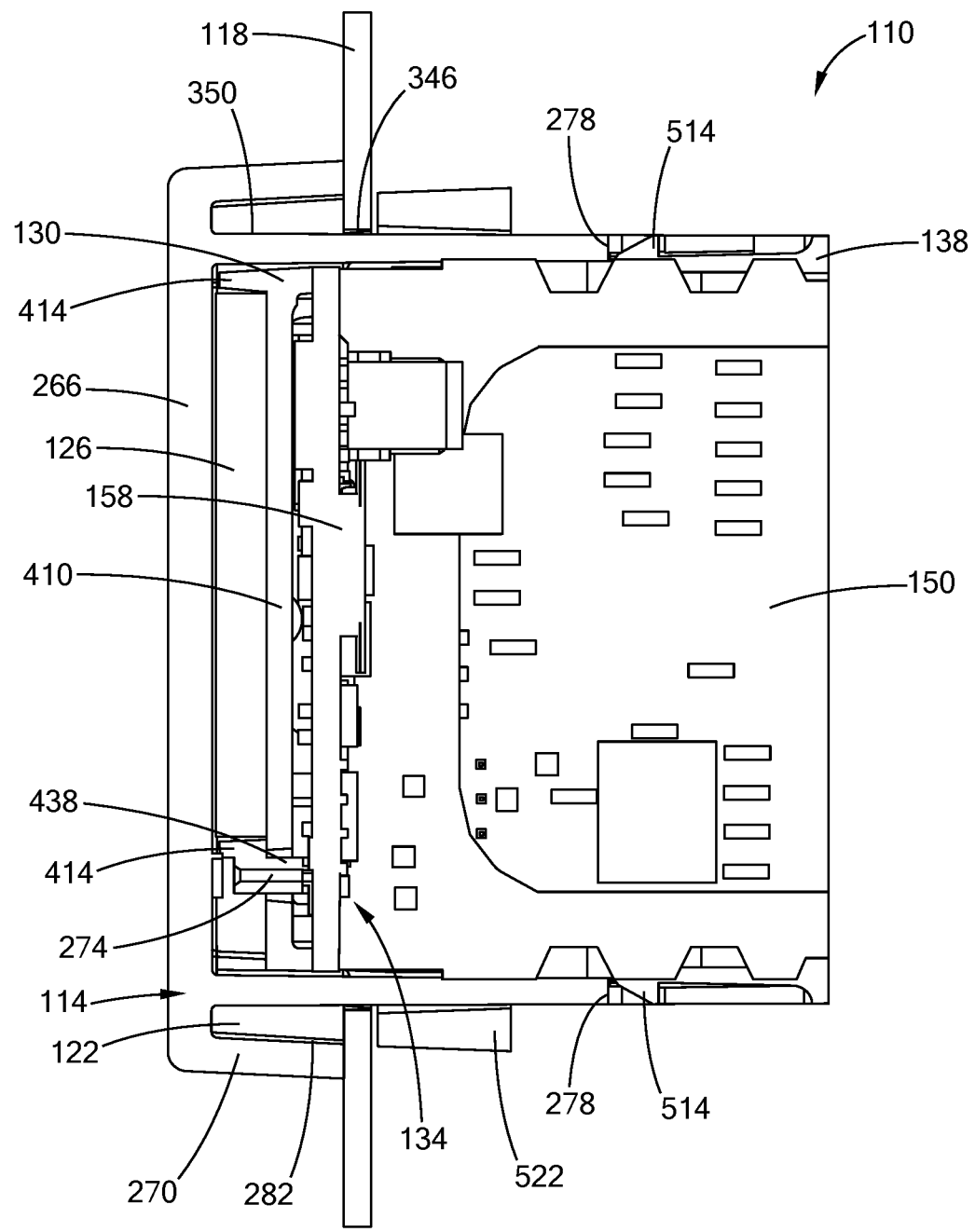
FIG. 6 is a cross-sectional view of the industrial controller device of FIG. 1.

Referring now to FIGS. 5 and 6, the facia plate 118 defines an aperture 346 that receives the inner shroud 214 but is smaller than the outer shroud 270. Thus, the outer shroud 270 is disposed about the aperture 346. The gasket 122 defines an aperture 350 for receiving the inner shroud 214. The gasket 122 is disposed about the inner shroud 214 and received in the gasket cavity 282. The gasket 122 is a resilient material. The facia plate 118 abuts the outer shroud 270 such that the gasket 122 forms a seal between the front panel body 114 and the facia plate 118 to inhibit liquids from migrating rearward between the facia plate 118 and the inner shroud 214.

The display 126 can be any suitable type of display configured for displaying text and/or graphics. In the example provided, the display 126 is a color liquid crystal display (LCD) with an input cable 352 configured to connect the display 126 to one of the boards 146, 150, 154, or 158. The display 126 is positioned between the carrier 130 and the facia wall 266 of the front facia 210. As described in greater detail below, the carrier 130 supports the display 126 to be aligned with the window 262 so that the display 126 is visible through the window 262. The inner shroud 214 is disposed about the display 126.

Figure 21:
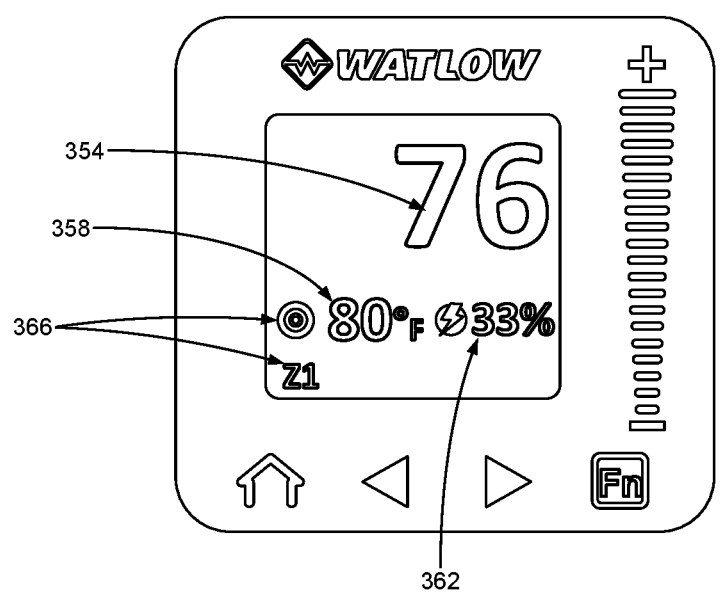
FIG. 21 is a front view of the industrial controller device of FIG. 1, illustrating an example display screen in accordance with the teachings of the present disclosure.

In one non-limiting example, shown in FIG. 21, the display can show a current process value 354, a set point value 358, a power level 362, and a plurality of mode indicators 366. In one non-limiting example, the current process value 354 could be a current temperature and the set point value 358 could be a desired temperature, though other configurations can be used. The visual output of the display 126 can be customizable and can be updated in real-time. In the example provided, the controller 134 is configured to adjust the font size of the current process value 354 based on the number of digits therein to improve visibility of the current process value 354. For example, the controller 134 can set the font size of the current process value 354 to be larger when the current process value 354 has fewer digits and be smaller when it has more digits. In the example provided, the display 126 is not a touch screen. In an alternative configuration, the display 126 can be a touch screen.

Figure 22:
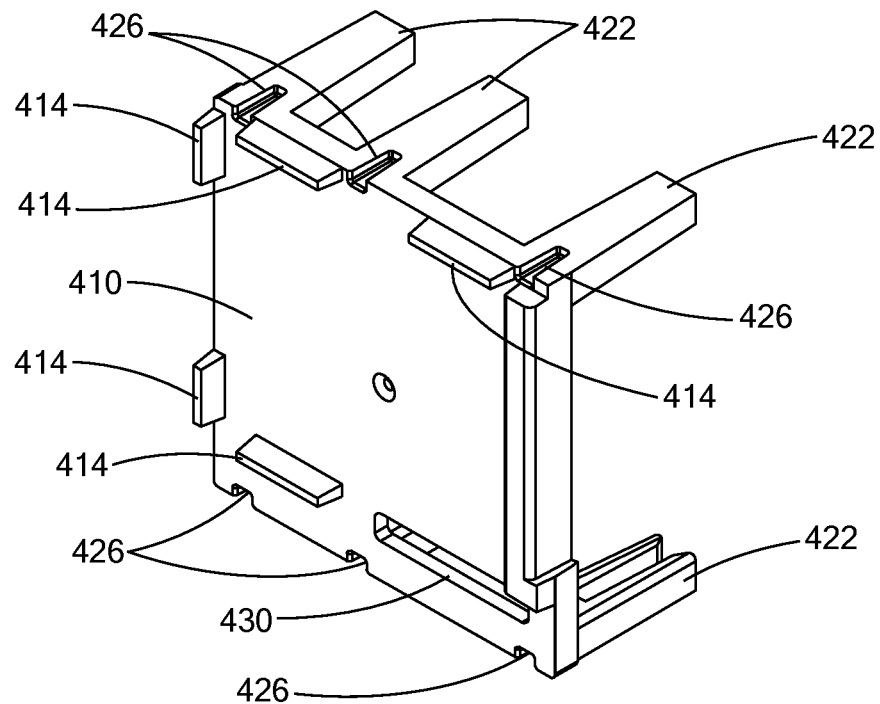
FIG. 22 is a front perspective view of a carrier of the industrial controller device of FIG. 1 in accordance with the teachings of the present disclosure.
Figure 23:
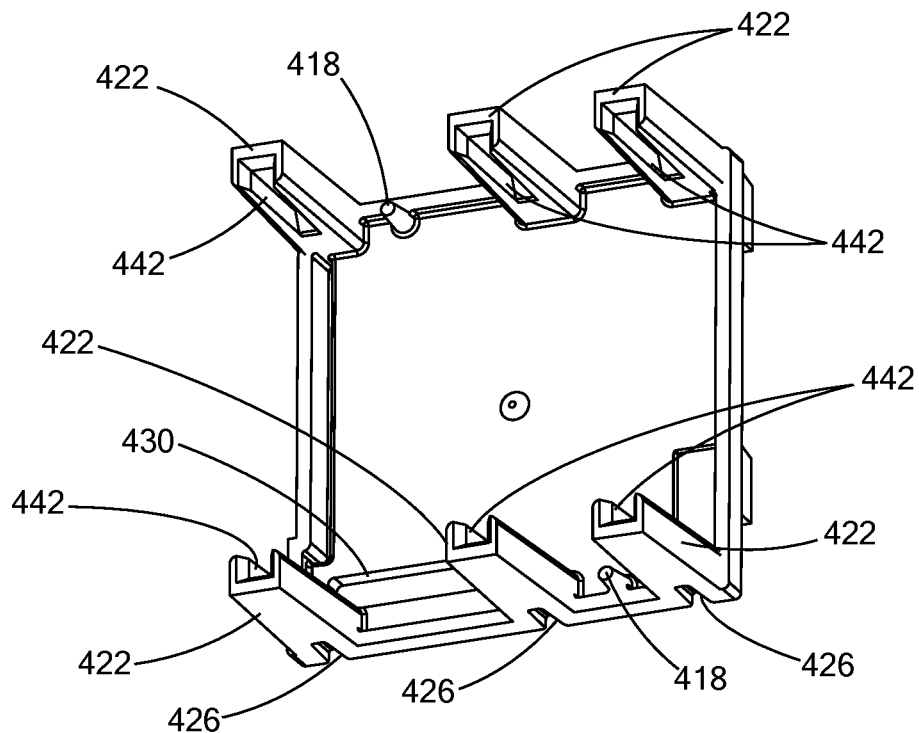
FIG. 23 is a rear perspective view of the carrier of FIG. 22.

Referring now to FIGS. 22 and 23, the carrier 130 is a solid molded body having a carrier plate 410, a plurality of display supports 414, alignment posts 418, and a plurality of board supports 422. The carrier 130 also defines a plurality of alignment grooves 426. Each alignment groove 426 is configured to receive a corresponding one of the locating ridges 286 of the front panel body 114. The display supports 414 extend from a forward side of the carrier plate 410 and are spaced apart to support and align the display 126. The carrier plate 410 defines an aperture 430 that permit the connector pins 274 (FIGS. 12 and 13) to extend through the carrier plate 410.

The alignment posts 418 extend from the rear side of the carrier plate 410 and are configured to be received in alignment slots or apertures 434 (FIG. 5) of the fourth board 158 (FIG. 5) to align the fourth board 158 (FIG. 5) relative to the carrier plate 410 such that the connector pins 274 (FIGS. 12 and 13) are connected to terminals 438 (FIGS. 5 and 6) on the fourth board 158 (FIGS. 5 and 6). The fourth board 158 (FIGS. 5 and 6) is supported by the carrier 130 between the carrier plate 410 and the first, second, and third boards 146, 150, 154 (FIG. 5). In the example provided, there are two alignment posts 418, though other configurations can be used. The board supports 422 extend from a rear side of the carrier plate 410 in opposed pairs. Each board support 422 defines a channel 442. The first board 146 (FIG. 5), the second board 150 (FIG. 5), and the third board 154 (FIG. 5) is each supported by a corresponding opposed pair of the board supports 422 such that the boards 146, 150, 154 (FIG. 5) are slidably received in the corresponding channels 442. Thus, the boards 146, 150, 154 (FIG. 5) are supported transverse to the fourth board 158 (FIG. 5).

With reference to FIG. 5, the first and second boards 146, 150 are printed circuit boards and, in the example provided, are configured to receive and send signals to and from an external system (not shown; e.g., a heater device) via the first and second connectors 162, 166. In the example provided, the third board 154 is a printed circuit board configured to receive input power from a power supply (not shown) via the third connector 170 and to convert and/or distribute the power for use by the components of the industrial controller device 110. The boards 146, 150, 154 have connector pins 446 that extend through a rear side of the housing 138 to connect the boards 146, 150, 154 to the corresponding connectors 162, 166, 170. The fourth board 158 can be connected to the boards 146, 150, 154 via corresponding pins and connectors (not specifically shown). One or more of the boards 146, 150, 154, 158 can also optionally include a wireless module (not specifically shown; e.g., Bluetooth or Wi-Fi) configured to permit wireless communication with the controller 134. In this example configuration, the controller 134 can communicate wirelessly with the external system (not shown) or a remote device (not shown), such as a remote computer system or a mobile device (e.g., mobile phone or tablet) for example. The remote device (not shown) can be used to view the status of and/or control the industrial controller device 110 and/or the remote device can be used to view the status of and/or control the external system (not shown) that is controlled by the industrial controller device 110.

The housing 138, surrounds at least a portion of the boards 146, 150, 154. The housing 138 can include a plurality of ventilation apertures 510 to permit airflow through the housing 138 to cool the controller 134. The housing 138 is coupled to the front panel body 114. In the example provided, the housing 138 includes a plurality of retaining clips 514 that resiliently snap into the retention apertures 278 of the inner shroud 214 to secure the front panel body 114 to the housing 138. A rear of the housing 138 includes apertures 518 (FIG. 3) through which the pins 446 of the boards 146, 150, 154 extend into the connectors 162, 166, 170, which are also received into the apertures 518.

The collar assembly 178 includes a front collar 522, a rear collar 526, and a pair of screws 530. The front collar 522 is disposed about the inner shroud 214 between the facia plate 118 and the retention apertures 278. In other words, the inner shroud 214 is received through an aperture 532 (FIG. 5) defined by a wall 546 of the front collar 522. The front collar 522 also includes a pair of lips 548 (FIGS. 3 and 4) that extend outward from the wall 546 on opposite sides of the front collar 522. Each lip 548 (FIGS. 3 and 4) includes a bore 534 (FIGS. 3 and 4) that do not extend fully through the lip 548 and are configured to receive an end of a corresponding one of the screws 530. In the example provided, the bores 534 (FIGS. 3 and 4) are not threaded and have an abutment surface (e.g., the bottom of the bore) that is abutted by the end of the screw 530, such that the screws 530 are free to rotate and slide axially relative to the front collar 522.

The rear collar 526 includes a wall 550 that defines an aperture 552 (FIG. 5) through which the housing 510 is received such that the rear collar 526 is disposed about the housing 510. The rear collar 526 further includes a pair of retaining clips 538 extending from the wall 550 on opposite sides of the rear collar 526 toward the front collar 522. Each retaining clip 538 is configured to resiliently snap into a corresponding one of the retention apertures 278 of the inner shroud 214. The wall 550 also defines a pair of threaded bores 542 that mate with threads of the screws 530 and are coaxially aligned with the bores 534 of the front collar 522. In the example provided, the threaded bores 542 are located on the same sides of the rear collar 526 as the retaining clips 538, though other configurations can be used. In operation, tightening the screws in the rear collar 526 pushes the front collar 522 forward against the facia plate 118 to maintain a seal between the gasket 122 and the facia plate 118, while the retaining clips 538 inhibit rearward movement of the rear collar 526.

Figure 24:
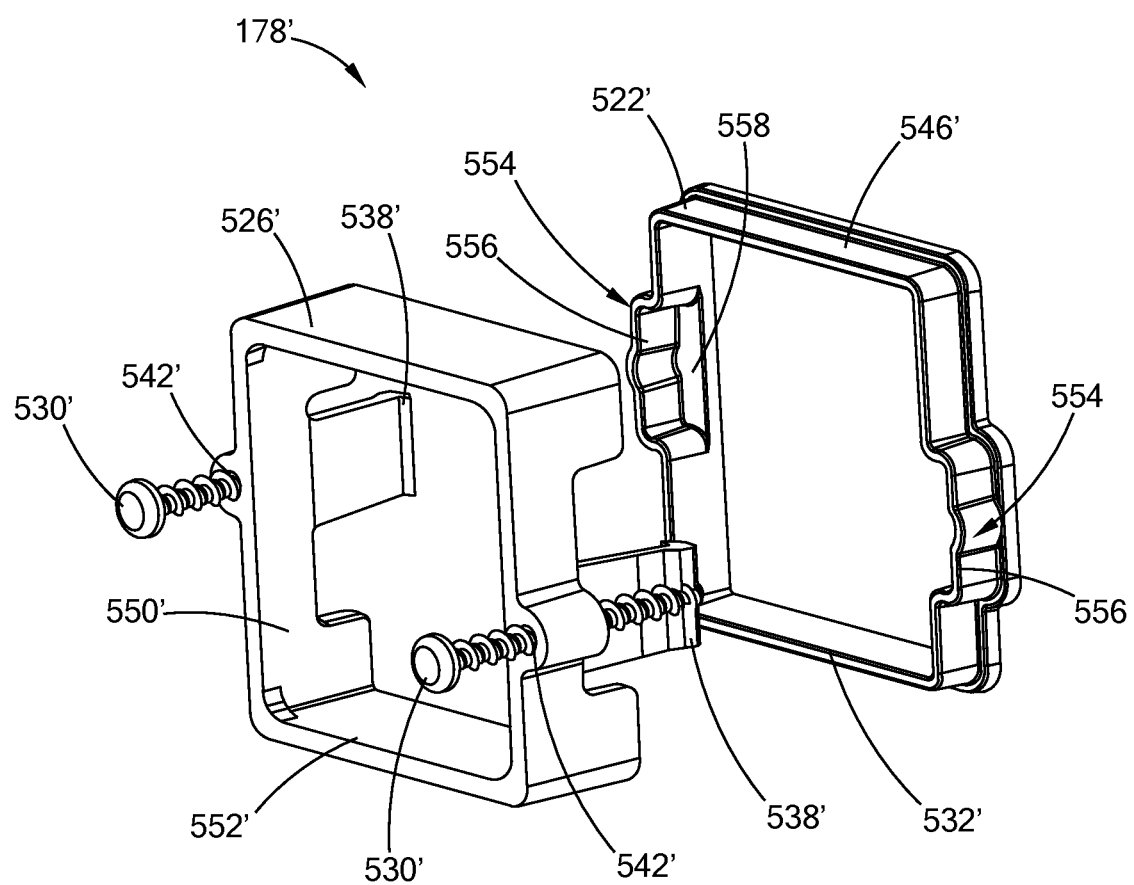
FIG. 24 is a perspective view of an alternative configuration of a collar assembly of the industrial controller device of FIG. 1 in accordance with the teachings of the present disclosure.
Figure 25:
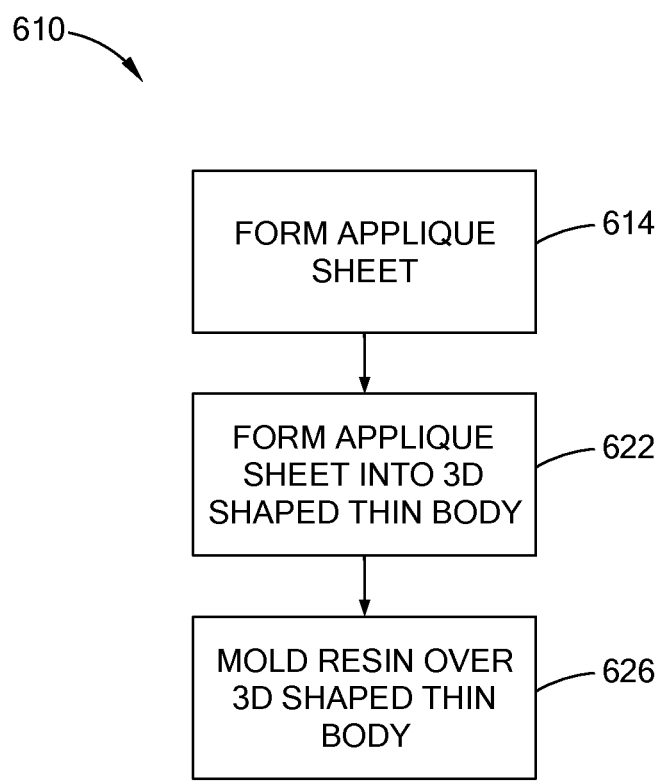
FIG. 25 is a flow chart of a method of constructing the front panel body of FIG. 10.

Referring to FIG. 24, a collar assembly 178' of a second configuration is illustrated. The collar assembly 178' is similar to the collar assembly 178 (FIGS. 1-5) except as otherwise shown or described herein. Accordingly features of the collar assembly 178' that are denoted by primed numerals are similar to those features of collar assembly 178 (FIGS. 1-5) denoted by similar but unprimed numbers, except as shown or described herein. The collar assembly 178' includes the front collar 522', the rear collar 526', and the pair of screws 530'. In the example provided, each bore 534 (FIGS. 3 and 4) is replaced by an embayment 554 in the front collar 522' configured to receive an end of a corresponding one of the screws 530'. In the example provided, the embayment 554 is defined by an outer wall 556 and an abutment surface 558 and is open in the direction toward the rear collar 526'. In the example provided, the embayment 554 is also open toward the housing 510 (FIGS. 1-5), though other configurations can be used. The outer wall 556 extends outward from the wall 546' of the front collar 522'. The ends of the screws 530' abut the abutment surface 558 such that the screws 530' are free to rotate and slide axially relative to the front collar 522'.

Referring to FIG. 25 and FIGS. 7-10B, a method 610 of constructing the front panel body 114 is illustrated in flow chart format. At step 614, the applique 218 is printed as a flat sheet with graphics on the front and conductive elements behind the graphics. In the example provided, the ink 222 (FIG. 7) is printed onto a thin film. In the example provided, the ink 222 is screen printed onto a flat polycarbonate sheet 710 such that the opaque background 234, the home input graphic 238, the left and right input graphics 242, 246, the function input graphic 250, the slider input graphic 254, and the logo 258 are printed onto the polycarbonate sheet 710 in their respective colors.

Figure 8:
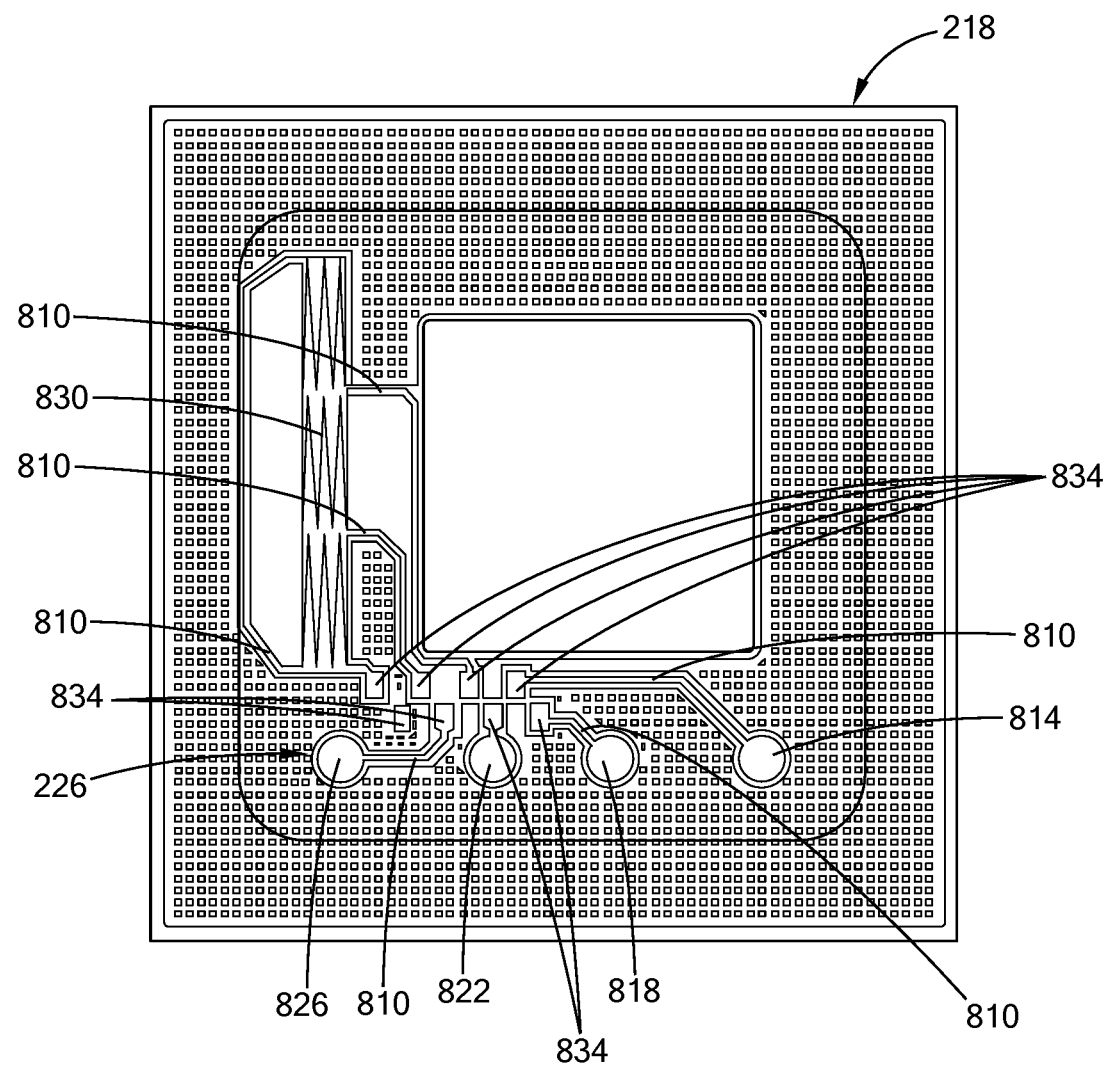
FIG. 8 is a rear view of the applique of FIG. 7.
Figure 9:
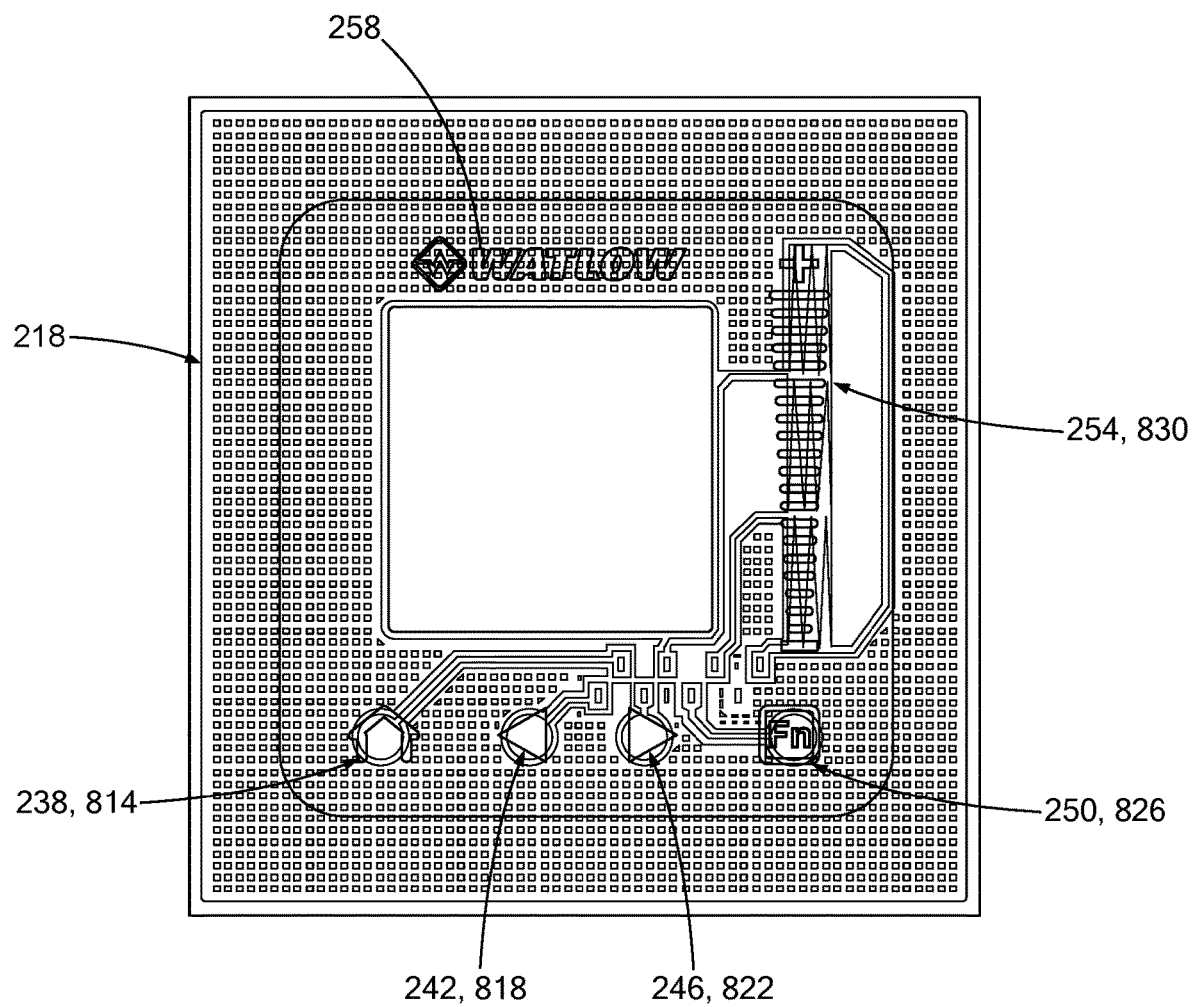
FIG. 9 is front view of the applique of FIG. 7, illustrating features of a first layer of the applique overlaid with features of a second of the applique.

In the example provided, electrically conductive ink is then printed onto the back of the polycarbonate sheet 710 to form electrical traces 810 (FIG. 8) and projective capacitive sensors 814, 818, 822, 826, 830 (FIG. 8). Each of the projective capacitive sensors 814, 818, 822, 826 is aligned with a corresponding one of the home input graphic 238, the left and right input graphics 242, 246, and the function input graphic 250, as shown in FIG. 9. The projective capacitive sensor 830 is aligned with the slider input graphic 254, as shown in FIG. 9.

Figure 10A:
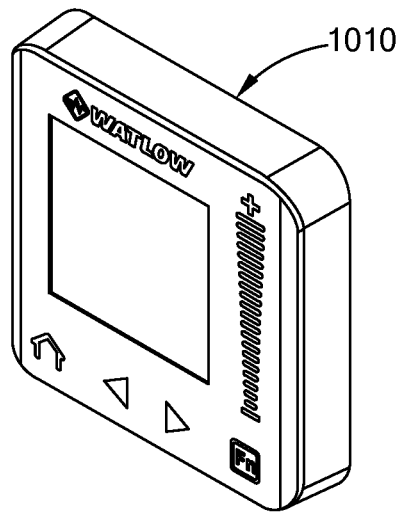
FIG. 10A is a front perspective view of the applique of FIG. 7 formed into a three-dimensional thin body used during the manufacture of the industrial controller device of FIG. 1 in accordance with the teachings of the present disclosure.

Next, at step 622, the polycarbonate sheet 710 with the applique 218 is formed into a three-dimensionally shaped thin body 1010 (FIG. 10A) that corresponds to the shape of the front facia 210. In the example provided, the polycarbonate sheet 710 is thermoformed into the three-dimensional shape of the thin body 1010 (FIG. 10A).

Figure 10B:
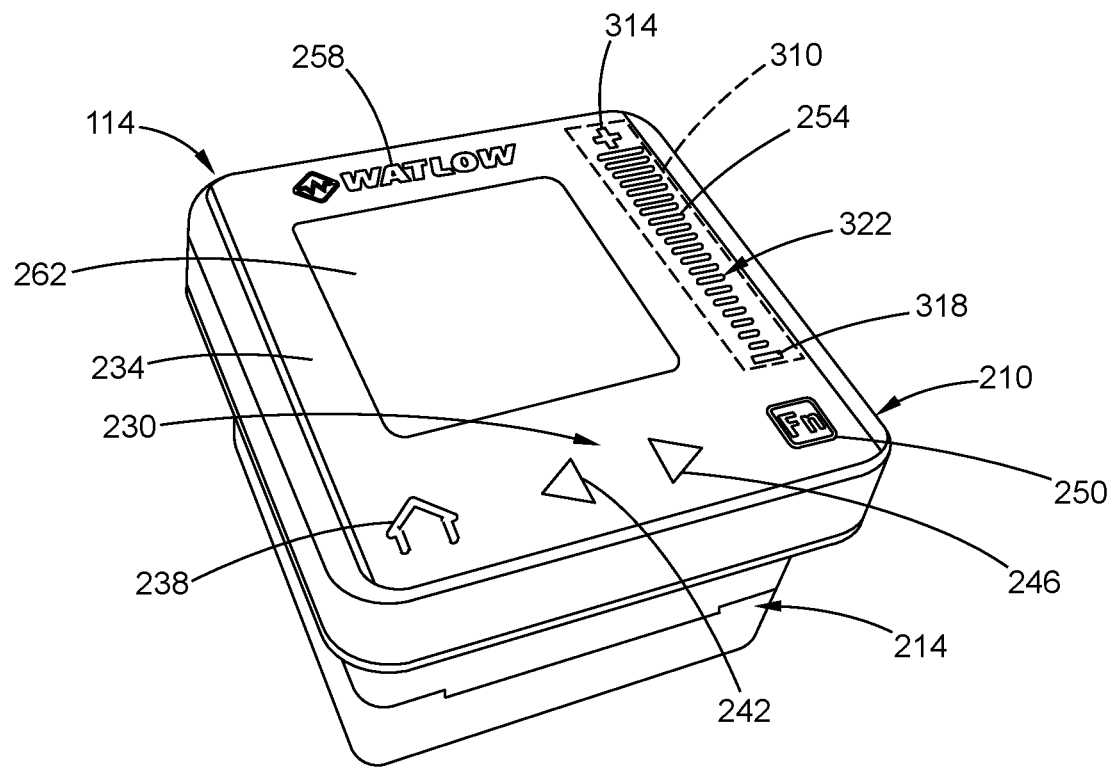
FIG. 10B is a front perspective view of a front panel body of the industrial controller device of FIG. 1.
Figure 11:
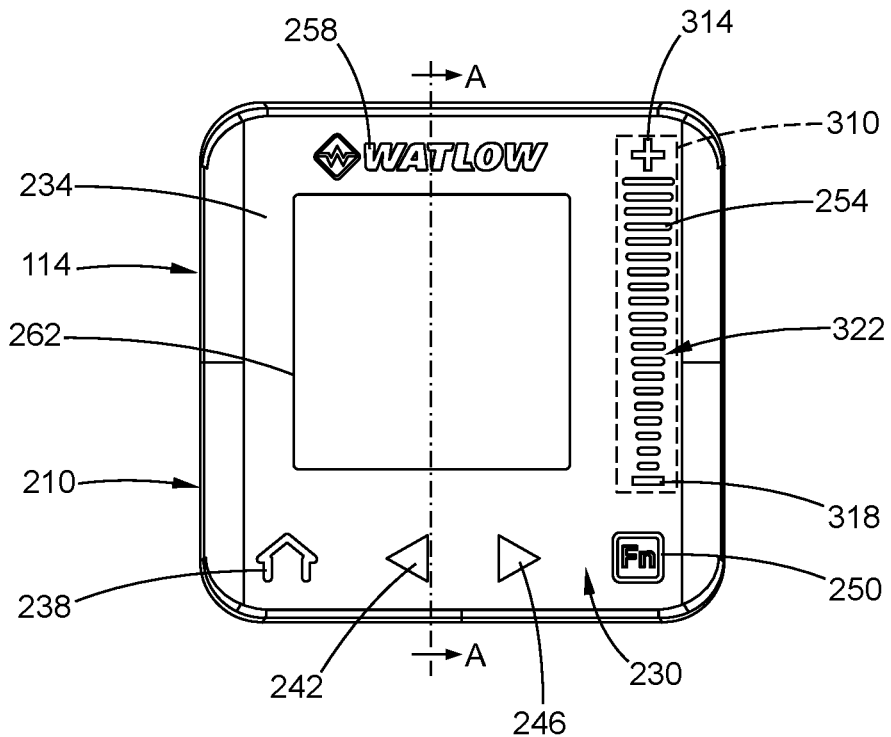
FIG. 11 is a front view of the front panel body of FIG. 10.

Next, at step 626, the three-dimensionally shaped thin body 1010 (FIG. 10A) is inserted into a mold (not shown) and a transparent (e.g., clear) resin (e.g., polymer) is molded around the three-dimensionally shaped thin body 1010 (FIG. 10A) to form the completed front panel body 114, as shown in FIG. 10B. In the example provided, the resin is injection molded around the three-dimensional thin body 1010 (FIG. 10A).

While the method 610 of in-molding and injection molding described in detail herein is one method of achieving a touch user interface (i.e., interface 230), other methods of achieving a touch user interface with a slider sensor 830 can be used. In one alternative construction, not shown, the front panel body 114 can be 3D printed, with the projective capacitive sensors 814, 818, 822, 826, 830, the electrical traces 810, and the input graphics 238, 242, 246, 250 being 3D printed therein. In another alternative construction, not shown, the slider sensor 830 can be a different type of touch user interface besides a projective capacitive sensor, while still being independent of the display 126.

Figure 7:
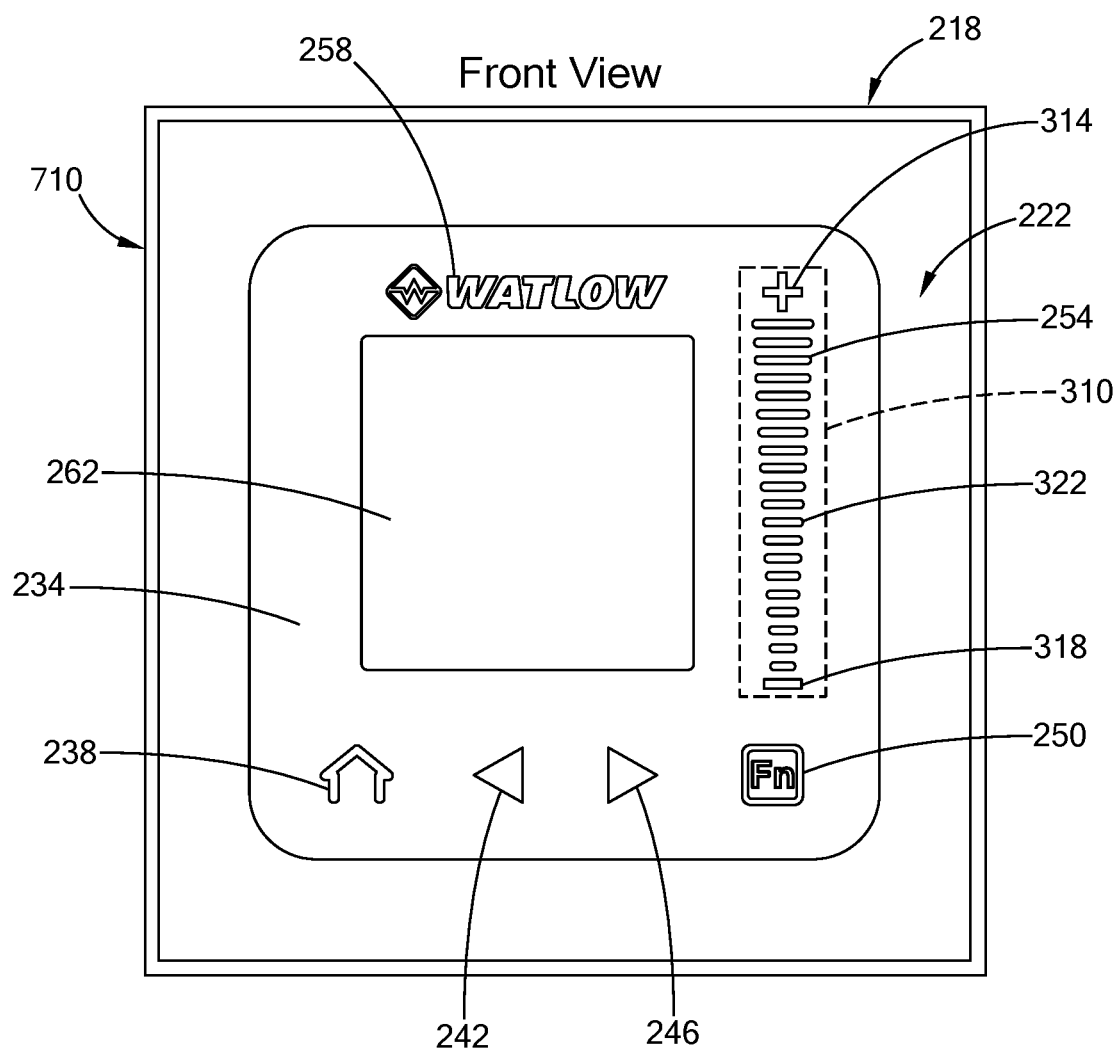
FIG. 7 is a front view of an applique of the industrial controller device of FIG. 1.

In operation, Referring to FIGS. 7-9, the projective capacitive sensors 814, 818, 822, 826 are constructed such that a user placing their finger on the input graphic 238, 242, 246, or 250 on the front side of the polycarbonate sheet 710 will change the capacitance across the corresponding projective capacitive sensors 814, 818, 822, 826, which can be detected by the controller 134 via the electrical traces 810. The projective capacitive sensor 830 is a slider sensor that changes capacitance based on the position of the user's finger along the elongated area 310 of the slider input graphic 254 and this change in capacitance can be detected by the controller 134 via the electrical traces 810.

The electrical traces 810 connect the projective capacitive sensors 814, 818, 822, 826, 830 to the connector pins 274 which can then be soldered to the traces at the locations shown by reference numeral 834 in FIG. 8. The change in capacitance of the sensors 814, 818, 822, 826, 830 is detected by the controller 134 and interpreted by the controller 134 as a user input. In the example provided the fourth board 158 interprets the change in capacitance. The controller 134 is configured to control the external system (not shown) and/or change an output of the display 126 based on that detected user input.

For example, placing the user's finger on the home input graphic 238 can cause the display to show a "home" or main screen or set of information. Placing a finger on the left or right input graphic 242, 246 can select different displayed options or scroll through options for example. Placing a finger on the function input graphic 250 can select a different mode or perform other functions for example. The controller 134 is configured to detect changes in position of the user's finger along the slider input graphic 254 including up and down sliding motion across the slider input graphic 254. In one configuration, the controller 134 can increase the set point temperature by a predetermined increment when the user taps the slider input graphic 254 closer to the plus symbol 314 (e.g., at a location above a mid-point between the plus symbol 314 and the minus symbol 318) and decrease the set point temperature when the user taps the slider input graphic 254 closer to the minus symbol 318. The size of this predetermined increment may optionally be proportional to a distance from the plus or minus symbol 314, 318. The controller 134 can also be configured to increase or decrease the set point temperature based on sliding motion of the user's finger along the slider input graphic 254 such that sliding a finger toward the plus symbol 314 can increase the set point temperature and sliding a finger toward the minus symbol 318 can decrease the set point temperature. The increase or decrease can be proportional to the speed at which the user slides their finger such that a quick slide with change the set point temperature a greater amount than a slow slide. Depending on the data shown on the display 126, tapping and/or sliding the user's finger along the slider input graphic 254 can also perform other functions such as scrolling through options or scrolling the screen for example.

As used herein, the phrase at least one of A, B, and C should be construed to mean a logical (A OR B OR C), using a non-exclusive logical OR, and should not be construed to mean "at least one of A, at least one of B, and at least one of C.

Unless otherwise expressly indicated, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

The terminology used herein is for the purpose of describing particular example forms only and is not intended to be limiting. The singular forms "a," "an," and "the" may be intended to include the plural forms as well, unless the context clearly indicates otherwise. The terms "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

In this application, the term "controller" may be replaced with the term "circuit". The term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The controller may include one or more interface circuits. In some examples the interface circuits may include wired or wireless interfaces that are connected to a local area network (LAN), the Internet, a wide area network (WAN), or combinations thereof. The functionality of the controller of the present disclosure may be distributed among multiple controllers that are connected via interface circuits.

In another form, the apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, examples that do not depart from the substance of the disclosure are intended to be within the scope of the disclosure. Such examples are not to be regarded as a departure from the spirit and scope of the disclosure. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An industrial control device comprising:
a display;
a body including an ink layer and a discrete a capacitive slider sensor that are encapsulated within a facia wall of the body, the ink layer including an opaque region that includes a first input graphic and an interior border, the interior border defining a window, the opaque region being between the capacitive slider sensor and a front surface of the body and overlapping an entirety of the capacitive slider sensor, the first input graphic overlapping the capacitive slider sensor, the window being transparent and aligned with the display to permit the display to be viewed through the window; and
a controller coupled to an output of the capacitive slider sensor to receive signals from the capacitive slider sensor, the controller being coupled to the display and configured to control the display.

2. The industrial control device according to claim 1, wherein the body is a molded body, the capacitive slider sensor is an in-molded capacitive slider sensor, and the first input graphic is an in-molded graphic.

3. The industrial control device according to claim 2, wherein the molded body is a transparent polymer that is injection molded around an applique.

4. The industrial control device according to claim 2, wherein the output of the capacitive slider sensor includes a plurality of in-molded electrical traces and the industrial control device further includes a plurality of connector pins directly connected to the plurality of in-molded electrical traces, the connector pins coupling the in-molded electrical traces to the controller for electrical communication therebetween.

5. The industrial control device according to claim 2 further comprising a carrier including a carrier plate and a plurality of board supports extending from a back side of the carrier plate, wherein the display is coupled to a front side of the carrier plate, wherein the controller includes a first circuit board and a plurality of second circuit boards, the first circuit board is coupled to the back side of the carrier plate and each second circuit board is received in a slot defined by a corresponding pair of board supports of the plurality of board supports.

6. The industrial control device according to claim 5, wherein one of the body and the carrier plate includes a plurality of locating ridges and the other of the body and the carrier plate defines a plurality of alignment grooves, each locating ridge being received in a corresponding alignment groove.

7. The industrial control device according to claim 1, wherein the capacitive slider sensor is a projective capacitive slider sensor.

8. The industrial control device according to claim 7, wherein the body further includes a plurality of second input graphics and a plurality of capacitive input sensors, each of the second input graphics overlapping a corresponding one of the capacitive input sensors.

9. The industrial control device according to claim 8, wherein a front surface of the body is a rigid material, the capacitive slider sensor being configured to be activated by contact with the front surface at an area overlapping the first input graphic and each second capacitive input sensor being configured to be activated by contact with the front surface at an area overlapping a corresponding second input graphic.

10. The industrial control device according to claim 1, wherein the controller is configured to adjust a set point value based on input from the capacitive slider sensor.

11. The industrial control device according to claim 10, wherein the controller is configured to change the set point value an amount proportional to a speed of a user activating the capacitive slider sensor.

12. The industrial control device according to claim 1 further comprising a housing coupled to the body, wherein the controller is disposed within the housing.

13. The industrial control device according to claim 12, wherein the housing includes a plurality of retaining clips and the body defines a plurality of retention apertures, each retaining clip resiliently snapping into a corresponding one of the retention apertures to couple the housing to the body.

14. The industrial control device according to claim 13, wherein the housing defines a plurality of ventilation apertures.

15. The industrial control device according to claim 1, wherein the body is a unitary molded body that includes an inner shroud and an outer shroud, the inner shroud being disposed about the display and extending in a rearward direction from a rear side of the facia wall, the outer shroud being disposed about the inner shroud and extending in the rearward direction from the rear side of the facia wall and spaced apart from the inner shroud to define a cavity, wherein the industrial control device further comprises a seal member disposed in the cavity and configured to form a seal with a facia plate disposed about the inner shroud.

16. The industrial control device according to claim 15 further comprising the facia plate, wherein the facia plate defines an aperture through which the inner shroud extends, the outer shroud being disposed about the aperture.

17. The industrial control device according to claim 15 further comprising a housing, a front collar, a rear collar, a pair of screws, and a pair of retaining clips, wherein the housing is coupled to the body and the controller is disposed within the housing, wherein the inner shroud defines a pair of retention apertures, the front collar being disposed about the inner shroud between the retention apertures and the facia plate and defining a pair of abutment surfaces, the rear collar being disposed about the housing, each retaining clip extending from the rear collar in a direction toward the front collar and being received in a corresponding one of the retention apertures, and each screw being threadably engaged to the rear collar and abutting a corresponding one of the abutment surfaces such that rotation of each screw in a predetermined rotational direction causes each screw to translate the front collar toward the facia plate.

18. The industrial control device according to claim 1, wherein the controller is configured to control the display to visually output a numeric value of a current process, the controller being configured to adjust a font size of the numeric value based on an amount of digits of the numeric value.

19. The industrial control device according to claim 3, wherein the ink layer is printed on a front side of the applique and the capacitive slider sensor is printed on an opposite side of the applique.

20. An industrial control device comprising:
a display;
a body including a molded transparent rigid material, a discrete projective capacitive slider sensor, a plurality of electrically conductive traces, a first input graphic, and a background graphic, wherein the projective capacitive slider sensor, the plurality of electrically conductive traces, the first input graphic, and the background graphic are in-molded in the transparent rigid material, the background graphic defining a window, the background graphic overlapping an entirety of the projective capacitive slider sensor such that the window does not overlap the projective capacitive slider sensor, the first input graphic overlapping the projective capacitive slider sensor, the window being transparent and aligned with the display to permit the display to be viewed through the window, wherein the plurality of electrically conductive traces are coupled to the projective capacitive slider sensor for electrical communication therewith;
a housing coupled to the body; and
a controller disposed within the housing and coupled to the plurality of electrically conductive traces to receive signals from the projective capacitive slider sensor, the controller being coupled to the display and configured to control the display.

21. The industrial control device according to claim 20, wherein the body includes an inner shroud and an outer shroud, the inner shroud being disposed about the display and the outer shroud being disposed about the inner shroud and spaced apart therefrom to define a cavity, wherein the industrial control device further comprises a seal member disposed in the cavity and configured to form a seal with a facia plate disposed about the inner shroud.

22. The industrial control device according to claim 21, further comprising a front collar, a rear collar, a pair of screws, and a pair of retaining clips, wherein the inner shroud defines a pair of retention apertures, the front collar being disposed about the inner shroud between the inner apertures and the facia plate and defining a pair of abutment surfaces, the rear collar being disposed about the housing, each retaining clip extending from the rear collar in a direction toward the front collar and being received in a corresponding one of the retention apertures, and each screw being threadably engaged to the rear collar and abutting a corresponding one of the abutment surfaces.

* * * * *